United States Patent
Lu et al.

(10) Patent No.: US 10,141,474 B2
(45) Date of Patent: Nov. 27, 2018

(54) PASSIVATION METHOD

(71) Applicant: TSMC SOLAR LTD., Taichung (TW)

(72) Inventors: Wei-Lun Lu, Tainan (TW); Chun-An Lu, Taichung (TW); Jyh-Lih Wu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 511 days.

(21) Appl. No.: 14/470,973

(22) Filed: Aug. 28, 2014

(65) Prior Publication Data

US 2016/0064591 A1   Mar. 3, 2016

(51) Int. Cl.
*H01L 31/18* (2006.01)
*H01L 31/032* (2006.01)
*H01L 31/0236* (2006.01)
*H01L 31/0749* (2012.01)
*H01L 31/00* (2006.01)

(52) U.S. Cl.
CPC .... *H01L 31/1868* (2013.01); *H01L 31/02363* (2013.01); *H01L 31/0322* (2013.01); *H01L 31/0749* (2013.01); *H01L 31/1864* (2013.01); *H01L 31/1884* (2013.01); *Y02E 10/541* (2013.01); *Y02P 70/521* (2015.11)

(58) Field of Classification Search
CPC ........... H01L 31/1868; H01L 31/02363; H01L 31/0749
See application file for complete search history.

(56) References Cited

U.S. PATENT DOCUMENTS

| | | | | |
|---|---|---|---|---|
| 2007/0289627 | A1* | 12/2007 | Singh ................ | H01L 31/03529 136/264 |
| 2008/0302418 | A1* | 12/2008 | Buller ............... | H01L 31/02168 136/259 |
| 2010/0319757 | A1 | 12/2010 | Oetting et al. | |
| 2011/0146770 | A1* | 6/2011 | Dieter ............... | H01L 31/02167 136/255 |
| 2014/0352768 | A1* | 12/2014 | Ito ..................... | H01L 31/02242 136/252 |
| 2015/0136608 | A1* | 5/2015 | Takada ................. | C25D 11/04 205/50 |

FOREIGN PATENT DOCUMENTS

CN            102549766 A       7/2012

OTHER PUBLICATIONS

Motahari, Sara, ".Surface Passivation of CIGS Solar Cells by Atomic Layer Deposition", Master of Science Thesis, Aug. 27, 2013, ITM_EGI_HPT_LIBRARY, KTH University, Stockholm, 14:30 (English), DiVA.*
Li, An-Ping et al "Fabrication and Microstructuring of Hexagonally Ordered Two-Dimensional Nanopore Arrays in Anodic Alumina", Advanced Materials, vol. 11, No. 6, p. 483-487, (1999).*

(Continued)

*Primary Examiner* — Angelo Trivisonno
(74) *Attorney, Agent, or Firm* — Duane Morris LLP

(57) ABSTRACT

A solar cell module includes a substrate; an absorber layer formed over the substrate; a porous alumina passivation layer formed on an upper surface of the absorber layer; a buffer layer conformably formed over the passivation layer; and a transparent conducting oxide layer conformably formed over the buffer layer.

16 Claims, 3 Drawing Sheets

(56) References Cited

OTHER PUBLICATIONS

Masuda, Hideki et al, "Self-Ordering of Cell Arrangement of Anodic Porous Alumina Formed in Sulfuric Acid Solution", Journal of Electrochemical Society, vol. 114, No. 5, p. L127-130, (1997).*

Li,Dongdong et al, "Fabrication of porous anodic alumina membranes with ultrathick barrier layer", Materials Letters, vol. 62, No. 17-18, pp. 3228-3231, (2008).*

Zhu, Xufei et al, "A novel nanostructure fabricated by an improved two-step anodizing technology", Electrochemistry Communications, vol. 29, p. 71-74, (2013).*

S. Motahari, "Surface Passivation of CIGS Solar Cells by Atomic Layer Deposition," Thesis, KTH University, Stockholm (2013) (Year: 2013).*

A. Ventura, "Anodic Aluminum Oxide (AAO) Membranes for Cellular Devices," Thesis, Lehigh Univ. (2013) (Year: 2013).*

Official Action dated Sep. 23, 2016 in counterpart Chinese patent application No. 2016092001451780.

Konig, D. et al., "Evidence of a high density of fixed negative charges in an insulation layer compound on silicon", Thin Solid Films, 2001, 385:126-131.

Hezel, R. et al., "Low-Temperature Surface Passivation of Silicon for Solar Cells", J. Electrochem. Soc., Feb. 1989, 136(2):518-523.

Agostinelli, G. et al., "Very low surface recombination velocities on p-type silicon wafers passivated with a dielectric with fixed negative charge", Solar Energy Materials & Solar Cells, 2006, 90:3438-3443.

B. Vermang et al., Blistering in ALD $Al_2O_3$ Passivation Layers as Rear Contacting for Local Al BSF Si Solar Cells, Solar Energy Materials & Solar Cells 101 (2012), pp. 204-209, Elsevier, www.elsevier.com/locate/solmat.

\* cited by examiner

PASSIVATION METHOD

BACKGROUND

The present disclosure relates to solar modules and particularly to thin film solar modules.

Conventional thin film solar modules, such as CIS-based solar modules (e.g., copper indium gallium (di)selenide or copper indium aluminum (di)selenide) (also referred to as "CIGS"), lack effective passivation between the absorber layer and the adjacent CdS buffer layer. The lack of effective passivation provides a shunting path from excessive binaries or defects, such as Mcu$^+$, $Cu_xSe_{1-x}$, or $Cu_xS_{1-x}$. This in turn limits the ability to improve the open circuit voltage (Voc) and shunting resistance of the device, which limits the ability to enhance the device's bandgap and thus performance.

Further, heretofore the only known effective approach to enhancing the energy bandgap near the GIGS absorber is through sulfur-incorporation or Ga-flattening.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
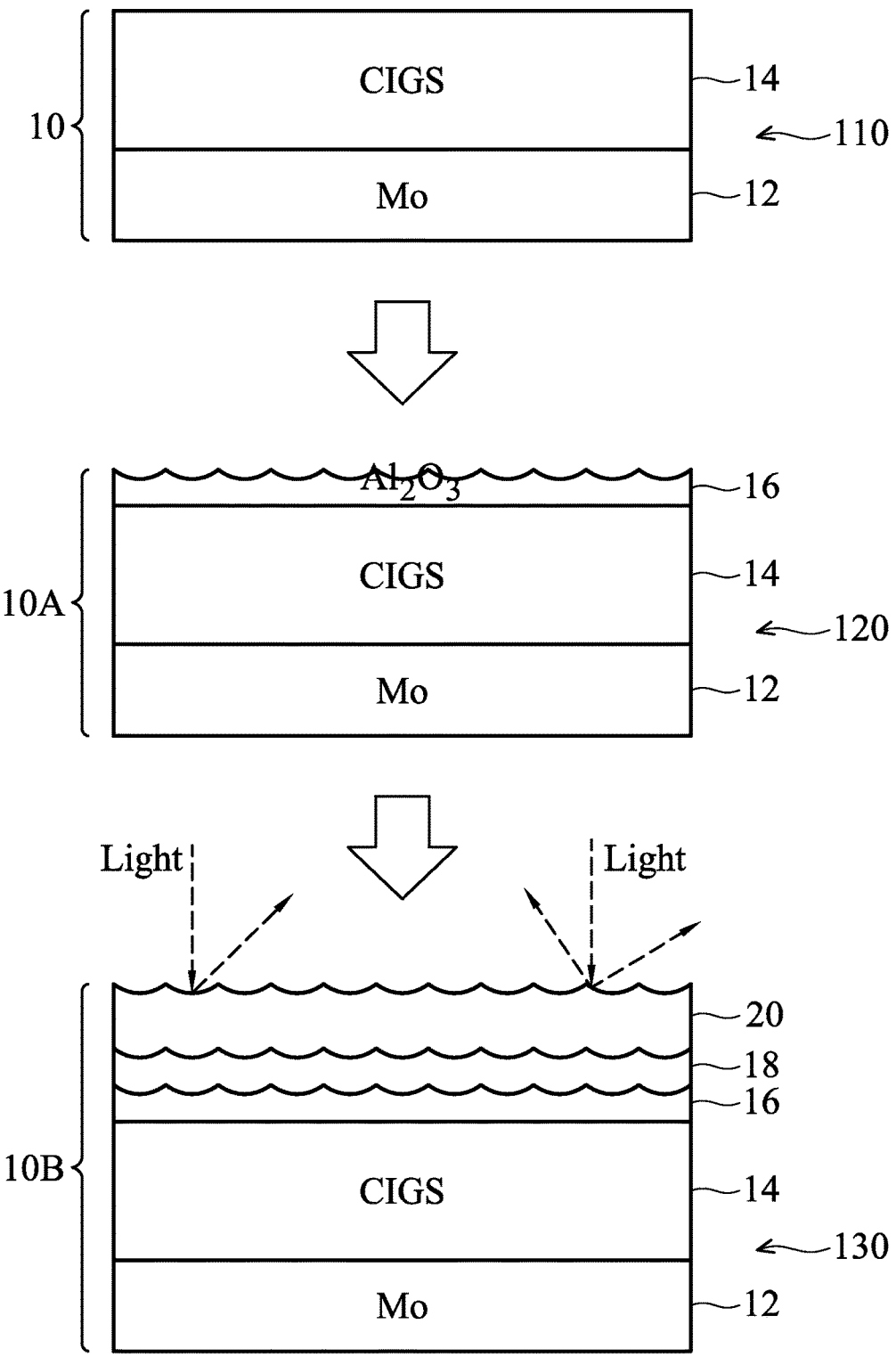
FIG. 1 illustrates a method of forming a passivated absorber layer for a solar cell module, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Likewise, terms concerning electrical coupling and the like, such as "coupled," "connected" and "interconnected," refer to a relationship wherein structures communicate with one another either directly or indirectly through intervening structures unless expressly described otherwise.

Embodiments of a method for surface passivation of p-CIGS absorber layers using a porous alumina ($Al_2O_3$) template are described herein. In certain embodiments, the passivation layer provides enhanced optical light-trapping. Further, in embodiments, the passivation layer operates to allow the energy band gap near the surface of the CIGS absorber layer to be increased, such as by incorporating residual Al content from the porous alumina through post-anneal treatment.

Generally, there are many dangling bonds with positive charges formed at the surface of a solar cell's crystalline silicon (c-Si) or CIGS absorber layer. In embodiments described herein, an alumina layer, such as one having a thickness of less than 200 nm, is formed on the top surface of a CIGS absorber layer of a solar module. The "native charges", which are an intrinsic characteristic of alumina, reduce surface recombination by passivating dangling bonds or excessive vacancies that are formed post SAS (sulfurization-after-selination). This passivation reduces the shunting path, which improves junction current (Jsc) and increase Voc.

Alumina is a wide band gap material (~8.8 eV) that is fully transparent over the wavelength of c-Si and thin film solar cells. Its refractive index can be modulated from 1.50 to 2.45 as desired through modulation of pore dimension. The optical transmittance (TT %) and light-scattering (also known as light-trapping or Haze %) of the solar cell can be improved through use of a textured surface morphology for the $Al_2O_3$. Techniques are described herein using a pore-widening methodology for improving light scattering.

In embodiments, Al content from $Al_2O_{3-x-y}$ is incorporated into the surface of CIGS absorber via a post anneal at a temperature of greater than 200° C., which forms a slight $Cu(In_{1-x}, Al_x)Se_2$ region or layer having a bandgap of around 1.09 to 1.57 eV for enhancing the band gap near the surface of CIGS absorber.

FIG. 1 illustrates a method 100 of forming a passivated absorber layer for a solar cell module. In embodiments, the absorber layer is a thin film CIGS layer, though the techniques described herein can be used to passivate c-Si absorber layers or other p$^+$ surfaces, such as may be found in LED displays.

At step 110, a structure 10 is provided, which in the illustrated embodiment includes a bottom electrode layer 12 of Mo having a CIGS absorber layer 14 formed thereon. At step 120, a textured, porous alumina layer 16 having desired pore dimensions between 20 to 1000 nm is formed on top of the CIGS absorber layer 14. This structure is identified in FIG. 1 with reference 10A. In embodiments, the thickness of this porous alumina layer 16 is less than 200 nm, and in some embodiments less than 100 nm.

At step 130, a buffer layer 18 is conformably formed over the upper surface of the porous alumina passivation layer 16. In embodiments, this buffer layer is formed from CdS, ZnS or ZnOS. Next, a TCO layer 20 (e.g., ZnO:Al (AZO), ZnO:Ga, $In_2O_3$:Sn (ITO), $SnO_2$:F (FTO), IZO, ZnO:B (BZO) or other suitable transparent conducting oxide layer) is conformably formed over the buffer layer 18. The resulting structure is identified in FIG. 1 with reference 10B.

The resulting structure 10B provides a rough texture to the layers formed over the absorber layer 14, which advantageously improves scattering and trapping of light incident on the TCO layer. Moreover, as discussed herein, the alumina layer not only passivates the surface of the p+ CIGS layer but can also increase the bandgap of the layer near the p-n junction of the solar cell.

Various techniques can be used to form the textured, porous alumina template passivation layer 16 at step 120 of the method of FIG. 1. In one embodiment, $Al_2O_3$ film is directly deposited on the top surface of the CIGS absorber layer 14 to a thickness of between about 50-200 nm. In embodiments, the alumina layer is sputtered onto the absorber layer and the desired porous texture, specifically the dimensions of the pores of the $Al_2O_3$ layer, is controlled via the deposition pressure and the $O_2$ gas ratio.

In another embodiment, a metallic Al film is deposited on the top surface of the CIGS absorber layer 14. In embodiments, the thickness of Al film is about 50-200 nm. After depositing this layer, an anodic oxidation method is used to fabricate the porous alumina passivation layer 16. This method is described in more detail in connection with FIG. 2.

Figure 2:
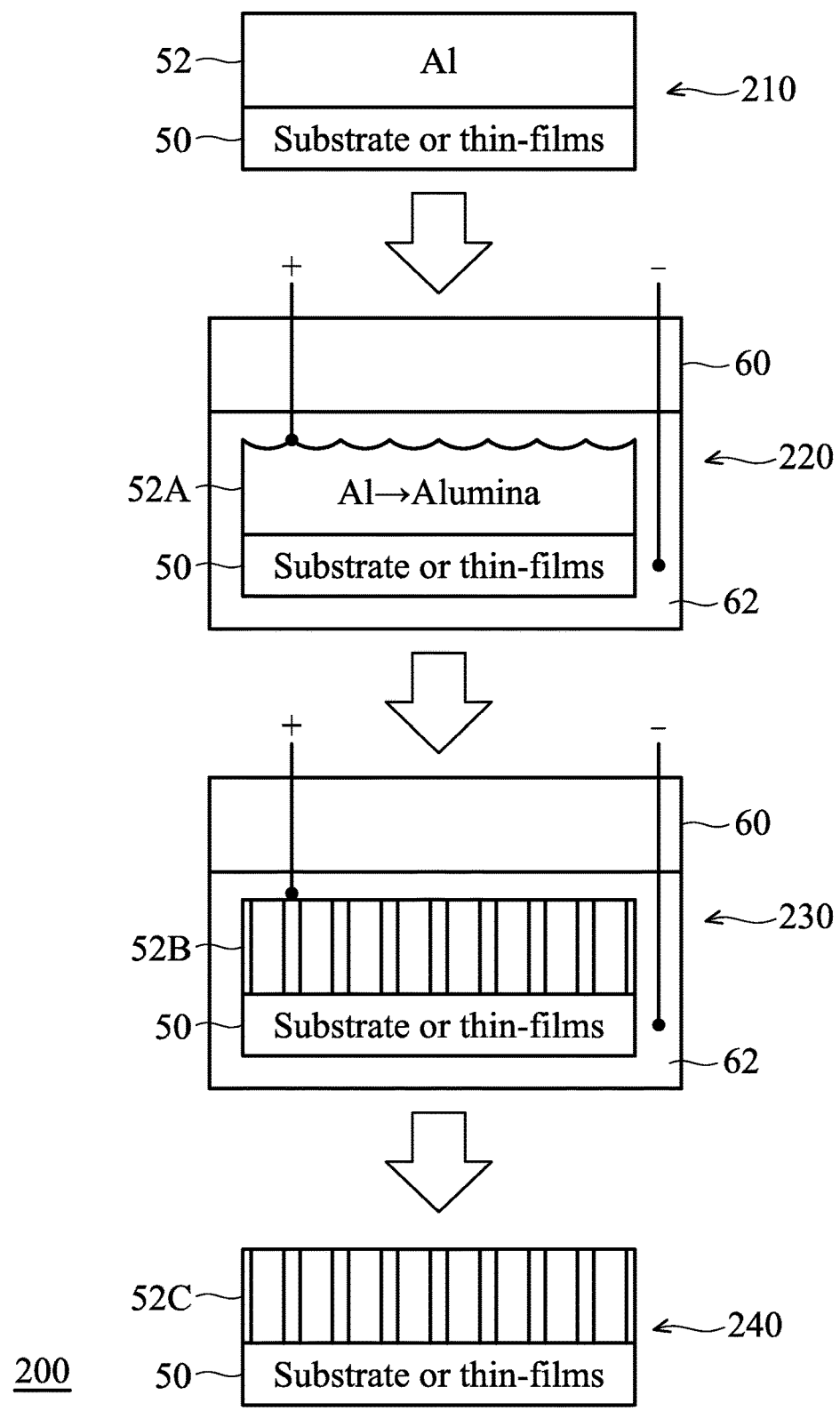
FIG. 2 illustrates an anodic oxidation method for forming a porous alumina passivation layer, in accordance with some embodiments.

With reference to FIG. 2, at step 210, an Al film 52 is deposited over any desired substrate or thin film 54 at a desired thickness. In embodiments, the substrates can be bare glass, Mo, CdS or a conductive thin film.

At step 220, the substrate with the Al film is submerged in a tank or chamber 60 having an oxidizing solution 62 therein. A voltage is applied to the structure relative to the solution, such as by connecting a positive electrode to the Al film and negative electrode to the solution 62. In embodiments, first oxidation conditions are applied to preliminarily etch a rough alumina template 52A. In embodiments, the oxidizing conditions for step 220 are as follows:

Bias voltage: about 20-120 V.
Temperature: about 10-25° C.
Duration: T1.
Solution: about 0.3 M-1.0M phosphoric acid ($H_3PO_4$).

At step 230, the pores of the alumnina layer 52A are widened to the desired size, forming porous alumina passivation layer 52B over the substrate 50. It should be understood that the pore dimension (i.e., diameter) is related (e.g., roughly linearly) to the applied voltage such that higher voltages result in larger pores. In embodiments, the pore-widening conditions used for step 230 are as follows:

Bias voltage: Greater than the bias voltage of step 220, e.g., about 60-180 V.
Temperature: Less than the temperature of the step 220, and in embodiments <10° C.
Duration: greater than the duration of step 220: T2 (T2>T1).
Solution: about 0.3 M-1.0M phosphoric acid ($H_3PO_4$).

Next, at step 240, the structure (50, 52B) is removed from the tank or chamber 60 and subjected to an anneal to form a dense porous alumina layer 52C. In embodiments, the post-anneal conditions are:

Temperature: <200° C.
Duration: about 10-30 minutes.
Environment: Air or oxygen ($O_2$) rich.

Figure 3:
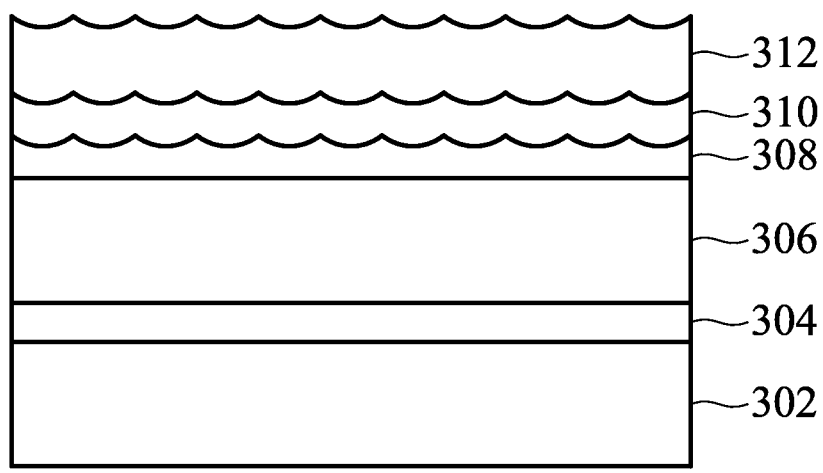
FIG. 3 is an illustration of an embodiment of a thin film solar cell module with a porous alumina passivation layer.

FIG. 3 is an illustration of an embodiment of a thin film solar cell module 300. As will be familiar to those in the art, though not illustrated, the module is composed of sub-cells by monolithic integration via P1/P2/P3 scribing connections. Starting from the bottom, the solar module includes a substrate layer 302, such as formed from glass or plastic. A back electrode layer 304, which may be formed from molybdenum, is formed over the substrate 302. A p-type absorber layer 306 is formed over the electrode layer 304. In embodiments, the layer is selected from a group of $Cu(In,Al)(Se,S)_2$ and $Cu(In,Ga)(Se,S)_2$ compounds. The thickness of the absorber layer 306 is, in embodiments, greater than or equal to 100 nm. A dense porous alumina passivation layer 308 as described herein is formed over the upper surface of the absorber layer 306. In embodiments, a post-anneal is used to form a slight Aluminum rich region or layer, e.g., a $Cu(In_{1-x}, Al_x)Se_2$ region, proximate or within the upper surface or region of the absorber layer 306 to enhance the band gap near the surface of CIGS absorber 306. A buffer layer 310 is conformably formed (i.e., to match the texture of the alumina layer 308) on the upper surface of the porous alumina passivation layer 308. In embodiments, the buffer layer 308 is formed of cadmium sulfide (CdS) and has a thickness of greater than or equal to 30 nm. An n-type TCO layer 312 is conformably formed on the buffer layer 310.

Using the techniques described herein, optical transmittance near the IR-wavelength can be improved through the modulation of the pore dimension and refractive indexes of porous alumina (Eg=6.4 eV; n=1.65) template. That is, a passivation layer with wider pores results in a more textured surface, which in turn provides for a higher haze ratio and better light-scattering effect.

The dielectric alumina on the CIGS absorber can form negative charges to reduce the surface recombination due to its effective field induced surface passivation. This passivation reduces the shunting path, which improves junction current (Jsc) and increase Voc.

Further, in embodiments, residual or non-oxided Al can be incorporated into the surface of the CIGS absorber to form $Cu(In,Al)Se_2$, which increases the bandgap (Eg) of the absorber in this area.

In embodiments of a solar cell module, the solar cell module includes a substrate; an absorber layer formed over the substrate; a porous alumina passivation layer formed on an upper surface of the absorber layer; a buffer layer conformably formed over the passivation layer; and a transparent conducting oxide layer conformably formed over the buffer layer.

In embodiments of a method of passivating an absorber layer of a solar cell module, the method includes providing an absorber layer formed over a substrate, and forming a porous alumina passivation layer on an upper surface of the absorber layer.

In embodiments of a method of forming a porous alumina passivation layer, the method includes depositing an aluminum (Al) film on a layer to be passivated; disposing the deposited aluminum film in an oxidizing bath at a first bias voltage and first temperature for a first duration of time to form a porous alumina layer; after the disposing step, opening pores of the porous alumina layer by disposing the alumina layer in the oxidizing bath and controlling the bias voltage, temperature and duration of time the alumina layer is disposed in the oxidizing bath.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of passivating an absorber layer of a solar cell module, comprising the steps of:

provided an absorber layer formed over a substrate, the absorber layer having a planar upper surface; and forming a porous alumina passivation layer on the upper surface of the absorber layer, wherein the porous alumina passivation layer has a passivating region directly over and in contact with the upper surface of the absorber layer operating to passivate the absorber layer and wherein in the passivating region the passivation layer has pore dimensions sufficient to provide a non-planar, textured upper surface;

conformably forming a buffer layer over the passivating region of the passivation layer; and conformably forming a transparent conducting oxide layer over the buffer layer, thereby providing the buffer layer and transparent conducting oxide layer each with a non-planar, textured upper surface over the passivating region of the passivation layer, wherein the non-planar, textured upper surfaces of the porous alumina passivation layer, buffer layer and transparent conducting oxide layer provide the solar cell with increased light scattering effect, as compared to planar, non-textured upper surfaces, as light passes through the textured upper surfaces to an area of the upper surface of the absorber layer in contact with and passivated by the passivating region of the porous alumina passivation layer.

2. The method of claim 1, wherein the absorber layer is a CIGS layer.

3. The method of claim 1, wherein the step of forming the porous alumina passivation layer comprises directly depositing an alumina film on the absorber layer.

4. The method of claim 3, wherein the alumina film is deposited via sputtering.

5. The method of claim 4, wherein the sputtering occurs in an oxygen gas environment, the method further comprising the step of controlling the deposition pressure and oxygen gas ratio to control a pore size of alumina passivation layer.

6. The method of claim 5, wherein the absorber layer is a CIGS layer.

7. The method of claim 1, wherein the step of forming the porous alumina passivation layer comprises:

depositing an aluminum (Al) film on the absorber layer; and oxidizing the aluminum film to form the alumina passivation layer.

8. The method of claim 7, wherein the oxidizing step comprises disposing the aluminum film in an oxidizing bath for a first period of time at a first bias voltage to oxidize the aluminum film, thereby providing an alumina template layer, and then disposing the alumina template layer in the oxidizing bath for a second period of time at a second bias voltage, the second bias voltage being greater than the first bias voltage and the first bias voltage being greater than 0V.

9. The method of claim 8, wherein the second period of time is greater than the first period of time.

10. The method of claim 9, wherein a temperature of the oxidizing bath during the second period of time is less than a temperature of the oxidizing bath during the first period of time.

11. The method of claim 7, wherein the absorber layer is a CIGS layer.

12. The method of claim 1, wherein the absorber layer is a CIGS layer, the method further comprising the step of after forming the alumina layer performing an annealing step to form a $Cu(In, Al)Se_2$ region at the upper surface of the CIGS layer under the functional passivating region of the passivation layer.

13. The method of claim 1, wherein the porous alumina passivation layer forming step comprises:

depositing an aluminum (Al) film on the upper surface of the absorber layer;

disposing the deposited aluminum film in an oxidizing bath at a first bias voltage and first temperature for a first duration of time to form a porous alumina layer; and after the disposing step, opening pores of the porous alumina layer by disposing the alumina layer in the oxidizing bath and controlling the bias voltage, temperature and duration of time the alumina layer is disposed in the oxidizing bath.

14. The method of claim 1, wherein the absorber layer is a crystalline silicon absorber layer.

15. The method of claim 12, wherein the $Cu(In, Al)Se_2$ region at the upper surface of the absorber has a bandgap between about 1.09-1.57.

16. The method of claim 1, wherein the absorber layer is a thin film absorber layer.

* * * * *